Feb. 28, 1967 E. L. HUNTER 3,307,109

RADIO RECEIVER WITH CIRCUIT PLATES

Filed July 15, 1963 2 Sheets-Sheet 1

INVENTOR.
EDWARD L. HUNTER

BY

*Ezekiel Wolf, Wolf and Greenfield*
ATTORNEYS

RADIO RECEIVER WITH CIRCUIT PLATES

Filed July 15, 1963 2 Sheets-Sheet 2

INVENTOR.
EDWARD L. HUNTER
BY
Ezekiel Wolf, Wolf and Greenfield
ATTORNEYS

United States Patent Office 3,307,109

Patented Feb. 28, 1967

3,307,109
RADIO RECEIVER WITH CIRCUIT PLATES

Edward L. Hunter, Randolph, Mass., assignor to Automatic Radio Mfg. Co., Inc., Boston, Mass., a corporation of Massachusetts Filed July 15, 1963, Ser. No. 295,088
5 Claims. (Cl. 325—357)

The present invention relates in general to radio receivers and more particularly concerns a novel, fully-transistorized vehicular radio receiver characterized by exceptionally high electrical performance attained with relatively few physical components. The component arrangement contributes to achieving the high performance while facilitating rapid fabrication on a mass production basis, a low rejection rate, reliable performance for long periods of time in the presence of wide climatic changes and severe mechanical vibrations, ease of servicing when and if needed.

It is an important object of this invention to provide a transportable low cost radio receiver with high electrical performance composed of relatively few physical components arranged to maximize the electrical performance while facilitating assembly on a mass production basis.

It is another object of the invention to achieve the preceding object with a receiver that is relatively insensitive to severe mechanical vibration and wide variations in climatic conditions.

It is still a further object of the invention to achieve the preceding object with a compact assembly that is easy to service.

According to the invention, the receiver comprises a plurality of radio frequency amplification stages. Each stage comprises an amplifying device, such as a transistor, having a plurality of electrodes. Means define a common terminal, typically maintained at reference or ground potential. Each stage has circuit plate comprising a flat plate of insulating material with conducting and resistive material thereon defining resistors and capacitors of values for connection to said amplifying device to coact therewith and comprise a said radio frequency amplification stage. Conducting leads support the flat insulating plate and electrically intercouple the resistors, capacitors, device electrodes and common terminal, each of the resistors and capacitors being circuit elements of only the associated one of the radio frequency amplification stages, counting interstage coupling elements connected to an associated stage.

A preferred form of the receiver according to the invention further comprises audio frequency and amplification stages comprising a plurality of audio amplification devices, such as transistors, with a plurality of audio device electrodes. An audio circuit plate comprising a flat plate of insulating material with conducting and resistive material thereon defines at least audio resistors for connection to the audio amplification devices to coact therewith and comprise the audio amplification stages. Conducting leads support the audio flat plate and electrically intercouple the audio resistors, the audio device electrodes and the common terminal, each of the audio resistors being circuit elements of the audio frequency amplification stages. An advantage of the structural arrangement just described is believed to reside in minimizing undesired coupling from one stage to another which might cause undesirable oscillations when the amplification per stage is very high. Accordingly, each stage may be characterized by exceptionally high gain without danger of oscillation or other unstable performance.

According to a preferred form of the invention, the receiver comprises a flat conducting chassis plate electrically connected to the common terminal. Means associated with a respective radio frequency amplification stage define a row of spaced terminals supported on one side of the chassis plate beside a slot formed in the chassis plate. The circuit plate associated with the respective stage resides in the slot with its conducting leads connected to respective ones of the spaced terminals. The amplifying device is on the said one side of the chassis plate with at least some of the device electrodes connected to respective ones of the spaced terminals. With this construction the chassis plate functions to help shield the amplifying device and keep ground potential physically close to circuit components. This physical arrangement is believed to further minimize undesired stray coupling between stages.

Numerous other features, objects and advantages of the invention will become apparent from the following specification when read in connection with the accompanying drawing, in which.

Figure 1:
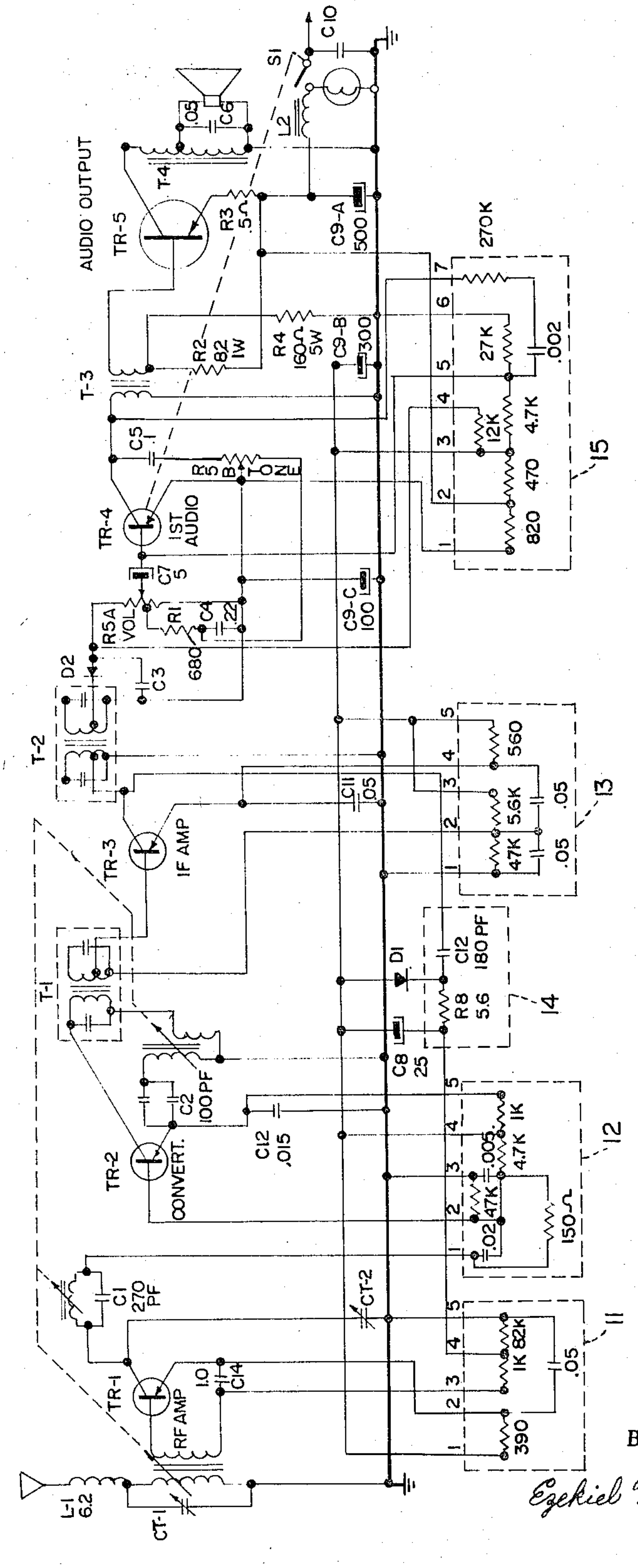
FIG. 1 is a schematic circuit diagram of a preferred embodiment of the invention.

With reference now to the drawing where the same reference symbols identify corresponding elements throughout, and more particularly FIG. 1 thereof, there is shown a schematic circuit diagram according to the invention. Since the electrical circuit itself is not an invention, it will be described briefly so as to avoid obscuring the invention. With the parameter value of most elements set forth in FIG. 1 and the techniques for choosing both the known and unknown parameter values well known in the radio receiver art, the brief description which follows is sufficient to enable one skilled in the art to practice the invention. The reference symbols identifying the different parts correspond to the reference symbols in the Owner's Guide of the Automatic Radio 1963 commercially available all-transistor push-button radio which lists the commercially available parts in the circuit of FIG. 1. All resistor values are in ohms, and all capacitor values in microfarads unless otherwise noted.

Transistor TR–1 and associated circuit components function as an R–F amplifier with a tuned base circuit receiving energy from the antenna circuit and a tuned collector circuit coupling energy from the collector of transistor TR–1 to the base of converter transistor T–2. The latter transistor oscillates at a frequency controlled by the tuned circuit in its emitter circuit at a frequency maintained substantially 262.5 kilocycles above the signal then being amplified by the R–F amplifier.

Emitter bypass capacitor C12 could be formed on circuit plate 12 when using a transistor type for transistor TR–2 with characteristics that can be reproduced with substantial uniformity. However, further economies in manufacturing costs are achieved by using a separate element for capacitor C12 whose value depends upon the characteristics of the type of transistor used for transistor TR–2 supplied by a particular manufacturer. Capacitor C12 coacts with transistor TR–2 to determine the gain slope of the tuner and the overall gain of the receiver. Thus, the transistor of the manufacturer selling at the lowest price may be employed while still maintaining the high electrical performance of the receiver and the high production rate.

I-F transformer T–1 is tuned to the I-F frequency of 262.5 kilocycles to selectively couple the I-F signal from the converter to transistor TR–3 for amplification. The output of transistor TR–3 is coupled by transformer T–2, also tuned to the I-F frequency of 262.5 kilocycles, to diode D2 for detection. The signal on the collector of transistor TR–3 is detected by diode D1 to develop an AVC signal that controls the gain of transistor TR–1. The detected signal from diode D2 is applied through a volume control to the audio amplification stages.

An important feature of the invention resides in using the separate circuit plates 11–13 each each of the R-F amplifier, converter and I-F amplifier radio frequency amplification stages. The circuit plates themselves are known in the art, but an important feature of this invention resides in confining resistances and capacitances on a single plate to a single radio frequency amplification stage. It has been discovered that this choice apparently reduces undesired interstage coupling while facilitating assembly to such an extent that exceptionally high stable gain has been repeatedly obtained from each assembly-line-produced radio receiver according to the invention with a marked increase in productivity and a marked reduction in rejects.

Figure 3:
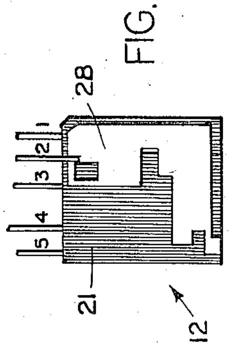
FIGS. 2 and 3 show views of opposite sides of a representative circuit plate having resistors and capacitors used in the converter stage of the receiver.
Figure 2:
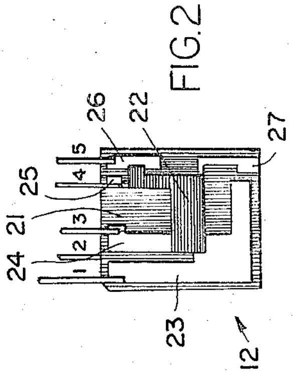

Referring to FIGS. 2 and 3, there is shown a view of opposite sides of the circuit plate 12 prior to encapsulation in insulating material to illustrate the physical structure of the typical circuit plate. Since the methods and means for fabricating these circuit plates is known in the art, specific illustration of but one circuit plate sufficiently supplies those skilled in the are with background information sufficient to understand the principles of the invention.

Circuit plate 12 comprises a flat insulating plate 21 with resistive material 22 and conducting material 23, 24, 25, 26, 27 and 28 deposited thereon. The leads are numbered 1–5 corresponding to leads 1–5 of circuit plate 12 in FIG. 1. The leads 1–5 are soldered to conducting plates 23, 28, 24, 25 and 26, respectively, and function for both electrical connection to and mechanical support of the circuit plate. The resistive material 22 between plate 23 and plate 24 comprises the 150-ohm resistance between leads 1 and 3. The capacitance between plates 23 and 28 introduces the 0.02 mfd. capacitance between leads 1 and 2. The resistive material 22 between plates 24 and 27, the latter being conductively connected to plate 28, comprises the 47K ohm resistance between leads 2 and 3. The capacitance between plate 24 and plate 28 establishes the 0.005 mfd. capacity between leads 2 and 3. The resistive material 22 between plate 27 and plate 25 comprises the 4.7K resistance between leads 2 and 4. The 1K resistance between leads 4 and 5 comprises resistive material 22 between plates 25 and 26.

Figures 4, 5:
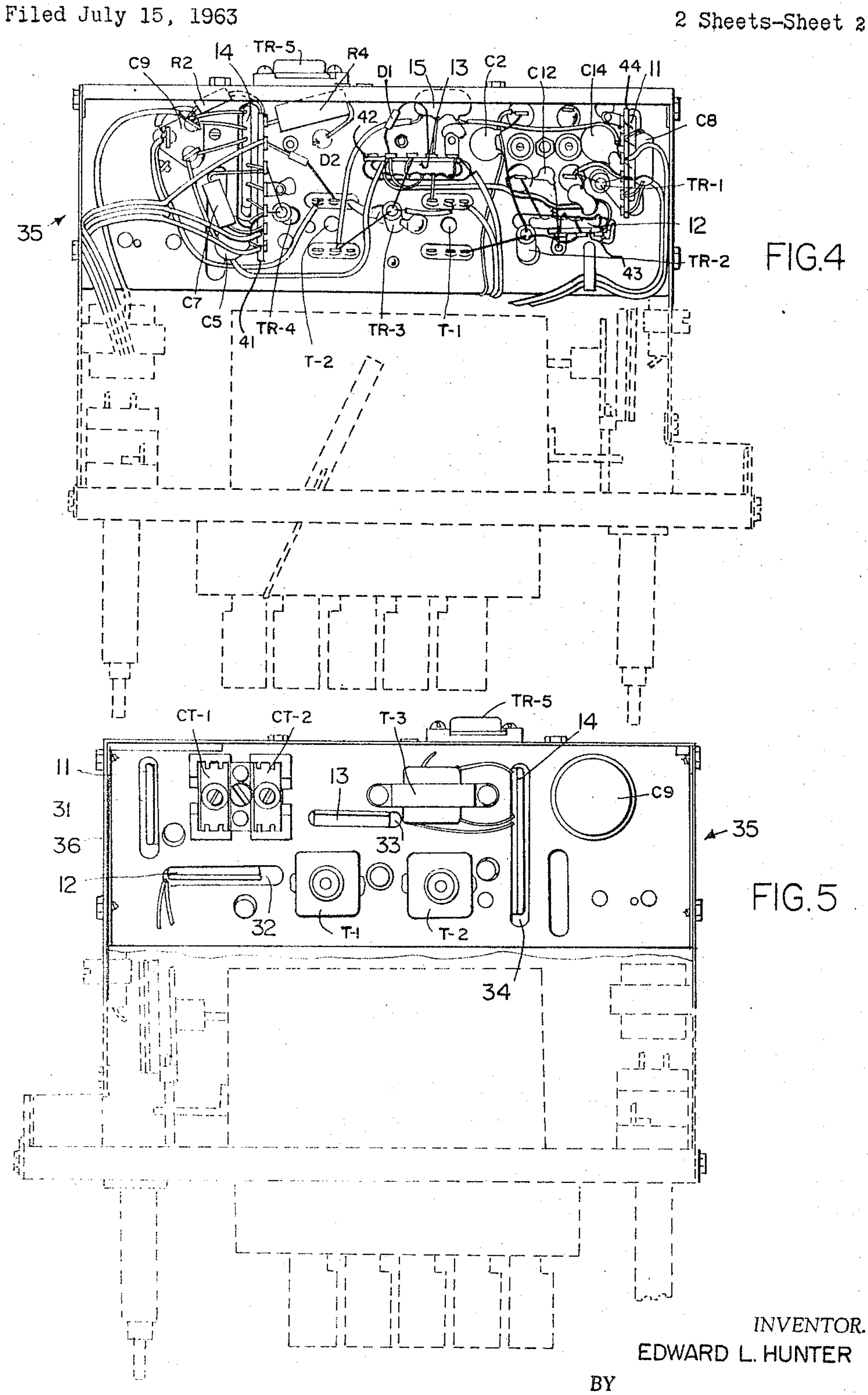
FIGS. 4 and 5 show bottom and top views respectively of the layout of a receiver according to the invention.

Referring now to FIGS. 4 and 5, there is shown a pictorial view of the bottom and top, respectively, of a chassis layout according to the invention showing the physical arrangement of the components comprising the radio frequency amplification stages and most of the audio frequency amplification stages. Other portions of the physical radio receiver are indicated by dotted lines to convey the relationship of the circuit chassis layout to the receiver as a whole, the portions represented in dotted lines being unnecessary for understanding the invention. As best seen in FIG. 5, those circuit plates 11, 12, 13 and 14 associated with the radio frequency and the audio frequency amplification stages reside in slots 31, 32, 33 and 34 with the plane of the plates generally perpendicular to the plane of the chassis plate 35. Circuit plate 11 is generally parallel to and adjacent to the wide edge 36 of chassis plate 35. Circuit plate 12 is generally parallel to the length of chassis plate 35 and located closely adjacent to circuit plate 11. Circuit plate 13 is generally parallel to a long edge of chassis plate 35 and besides the lengthwise portion of the chassis plate spanned by transformers T1 and T2. Circuit plate 14 is generally parallel to a wide edge of chassis plate 35. Circuit plate 15 rests against the bottom of chassis plate 35 as shown in FIG. 4.

A feature of the invention resides in locating terminal strips 41–44 immediately beside slots 31–34. Each of these terminal strips has a plurality of spaced terminals for supporting leads from the circuit plates 11–14, respectively, and from other circuit elements. This arrangement provides a high ratio of circuit components per unit volume in the vicinity of the circuit plates while taking up relatively little horizontal area. Thus, attachment of components with relatively short lead lengths is easily attained. Yet, there is ample room for assembling by an unskilled worker or for later servicing should that become necessary. Furthermore, the slot functions as an assembly jig. And the small number of physical components, physical components which are easy to attach with good electrical and mechanical connections by a relatively unskilled worker, facilitates rapid assembly while achieving exceptionally high electrical performance.

In a typical receiver according to the invention, transistors TR–1, TR–2, TR–3, TR–4 and TR–5 are type 2N640, 2N642, 2N641, 2N591 and 2N176, respectively. With a 14-volt battery connected across spark plate capacitor C10, a full 1-watt output is obtained at 400 cycles when an input signal of but 4 microvolts at 1600 kilocycles with 30% modulation is applied to the antenna input terminal. Over 300,000 receivers have been satisfactorily manufactured and sold with returns of less than 0.1%.

It is evident that those skilled in the art may now make numerous modifications of and departures from the specific embodiment described herein without departing from the inventive concepts. Consequently, the invention is to be construed as limited solely by the scope and spirit of the appended claims.

What is claimed is:

1. A radio receiver having radio frequency amplification stages each comprising,
- an amplifying device having a plurality of electrodes,
- means defining a common terminal,
- a flat plate of insulating material with conducting and resistive material thereon defining resistors and capacitors of values for connection to said amplifying device to coact therewith and comprise a said radio frequency amplification stage,
- conducting leads supporting said flat plate and electrically intercoupling said resistors, capacitors, electrodes and common terminal,
- each of said resistors and capacitors being circuit elements of only one of said radio frequency amplification stages,
- a flat conducting chassis plate electrically connected to said common terminal,
- means associated with a respective radio frequency amplification stage defining a row of spaced terminals supported on one side of said chassis plate beside a slot formed in said chassis plate,
- said flat plate being located in said slot with said conducting leads connected to respective ones of said terminals,
- said amplifying device being on said one side of said chassis plate with at least some of said device electrodes connected to respective ones of said terminals.

2. A radio receiver in accordance with claim 1 and further comprising,
- audio frequency amplification stages comprising a plurality of audio amplification devices with a plurality of audio device electrodes,
- an audio flat plate of insulating material with conducting and resistive material thereon defining at least audio resistors and capacitors for connection to said audio amplification devices to coact therewith and comprise said audio amplification stages,
- and conducting leads supporting said audio flat plate and electrically intercoupling said audio resistors, said audio device electrodes and said common terminal,
- each of said audio resistors and capacitors being circuit elements of only said audio frequency amplification stages.

3. A radio receiver in accordance with claim 1 and further comprising, means defining shielded radio frequency transformers located on said other side of said chassis having input and output transformer terminals extending through said chassis plate on said one side, said terminals and said transformers intercoupled by at least one of said radio frequency amplification stages.

4. A radio receiver in accordance with claim 3 wherein at least one radio frequency amplification stage, is an intermediate frequency amplification stage, the first of said radio frequency amplification stages is a radio frequency signal amplifier, the second of said radio frequency amplification stages is a conversion stage for converting the radio frequency signal amplified by said first stage to an intermediate frequency signal for amplification by said intermediate frequency amplification stage, said chassis plate being generally rectangular, the plate of insulating material associated with said first stage being parallel to a wide edge of said chassis plate and generally perpendicular to said chassis plate, the plate of insulating material associated with said second stage being parallel to a long edge of said chassis plate, closely adjacent to said first stage plate of insulating material, and generally perpendicular to said chassis plate.

5. A radio receiver in accordance with claim 4 wherein said radio frequency transformers are spaced along the length of said chassis plate, the plate of insulating material associated with said intermediate frequency stage being parallel to the length of said chassis plate and beside said radio frequency transformers.

References Cited by the Examiner

UNITED STATES PATENTS

| | | | |
|---|---|---|---|
| 2,963,577 | 12/1960 | Errichiello et al. ----- | 325—355 |
| 3,217,209 | 11/1965 | Kinsella et al. ------- | 317—101 |

KATHLEEN H. CLAFFY, *Primary Examiner.*

R. S. BELL, *Assistant Examiner.*